US012770682B2

(12) United States Patent
Rout et al.

(10) Patent No.: US 12,770,682 B2
(45) Date of Patent: Oct. 20, 2026

(54) STORAGE DEVICE AND METHOD OF PERFORMING READ AND WRITE OPERATIONS

(71) Applicant: Arm Limited, Cambridge (GB)

(72) Inventors: Sujit Kumar Rout, Bangalore (IN); Daksheshkumar Maganbhai Malaviya, Bangalore (IN); Navin Agarwal, Bangalore (IN); Yattapu Viswanatha Reddy, Bangalore (IN); Hemant Hemraj Parate, Bangalore (IN)

(73) Assignee: Arm Limited, Cambridge (GB)

( * ) Notice: Subject to any disclaimer, the term of this patent is extended or adjusted under 35 U.S.C. 154(b) by 79 days.

(21) Appl. No.: 18/779,825

(22) Filed: Jul. 22, 2024

(65) Prior Publication Data

US 2026/0024577 A1 Jan. 22, 2026

(51) Int. Cl.

| | |
|---|---|
| ***G11C 11/41*** | (2006.01) |
| ***G11C 5/06*** | (2006.01) |
| ***G11C 11/418*** | (2006.01) |
| ***G11C 11/419*** | (2006.01) |

(52) U.S. Cl.

CPC ............ *G11C 11/419* (2013.01); *G11C 5/063* (2013.01); *G11C 11/418* (2013.01)

(58) Field of Classification Search

CPC ...... G11C 11/419; G11C 5/063; G11C 11/418

See application file for complete search history.

(56) References Cited

U.S. PATENT DOCUMENTS

| | | | | |
|---|---|---|---|---|
| 7,359,266 B2 * | 4/2008 | Song | ..................... | G11C 11/413 365/72 |
| 2012/0147682 A1 * | 6/2012 | Schreiber | ................ | G11C 7/22 365/191 |

* cited by examiner

*Primary Examiner* — Xiaochun L Chen

(74) *Attorney, Agent, or Firm* — DeWitt LLP

(57) ABSTRACT

Systems and methods of controlling a read operation and a write operation at a storage device storage device including: core circuitry including one or more bitcells, each bitcell accessible via a corresponding bitline and wordline; column selection circuitry to, responsive to a column select signal, select at least one bitcell via one or more bitlines; wordline selection circuitry to, responsive to a wordline select signal, select the at least one bitcell via one or more wordlines; control circuitry to, in a first mode of operation: provide a first wordline select signal to the wordline selection circuitry responsive to a first control signal; provide first and second column select signals to the column selection circuitry responsive to a second control signal, and where the first column select signal is to control a read operation and the second column select signal is to control a write operation.

16 Claims, 7 Drawing Sheets

STORAGE DEVICE AND METHOD OF PERFORMING READ AND WRITE OPERATIONS

TECHNICAL FIELD

The present technology relates to a storage device(s) or system(s) and method(s) of performing read and write operations in such a device or system.

BACKGROUND

Some conventional storage devices or systems (hereafter "devices") use evict and allocation (EVA) operations, where in a read operation or sequence or cycle (hereafter "operation") to read data in a bitcell occurs responsive to a first pulse of a clock signal and then, in a write operation, data is written to the same bitcell responsive to a subsequent pulse of the same clock signal.

There is a need for improved EVA operations in storage systems.

SUMMARY

According to a first aspect of present techniques, there is provided a storage device comprising: core circuitry comprising one or more bitcells, each bitcell accessible via a corresponding bitline and wordline; column selection circuitry to, responsive to a column select signal, select at least one bitcell via one or more bitlines; wordline selection circuitry to, responsive to a wordline select signal, select the at least one bitcell via one or more wordlines; control circuitry to, in a first mode of operation: provide a first wordline select signal to the wordline selection circuitry responsive to a first control signal; provide first and second column select signals to the column selection circuitry responsive to a second control signal, and where the first column select signal is to control a read operation and the second column select signal is to control a write operation.

According to a further aspect of present techniques, there is provided a method of controlling a read operation and a write operation at a storage device, the storage device having: core circuitry comprising one or more bitcells, each bitcell accessible via a corresponding bitline and wordline; column selection circuitry to, responsive to a column select signal, select at least one bitcell via one or more bitlines; wordline selection circuitry to, responsive to a wordline select signal, select the at least one bitcell via one or more wordlines; and control circuitry to operate in a first mode or second mode, the method comprising: providing, from the control circuitry operating in the first mode to the wordline selection circuitry, a first wordline select signal responsive to a first control signal; providing, from the control circuitry operating in the first mode to the column selection circuitry, first and second column select signals responsive to a second control signal, and where the first column select signal is to control a read operation and the second column select signal is to control a write operation.

According to a further aspect of present techniques, there is provided a non-transitory computer-readable medium to store computer-readable code for fabrication of any circuitry described herein.

BRIEF DESCRIPTION OF THE DRAWINGS

Various embodiments using the present techniques will now be described by way of example only and with reference to the accompanying drawings in which.

DETAILED DESCRIPTION OF THE DRAWINGS

Details of methods, apparatuses, and processors according to examples will become apparent from the following description, with reference to the Figures. In this description, for the purpose of explanation, numerous specific details of certain examples are set forth. Reference in the specification to 'an example' or similar language means that a particular feature, structure, or characteristic described in connection with the example is included in at least that one example, but not necessarily in other examples. It should further be noted that certain examples are described schematically with certain features omitted and/or necessarily simplified for ease of explanation and understanding of the concepts underlying the examples.

Figure 1A:
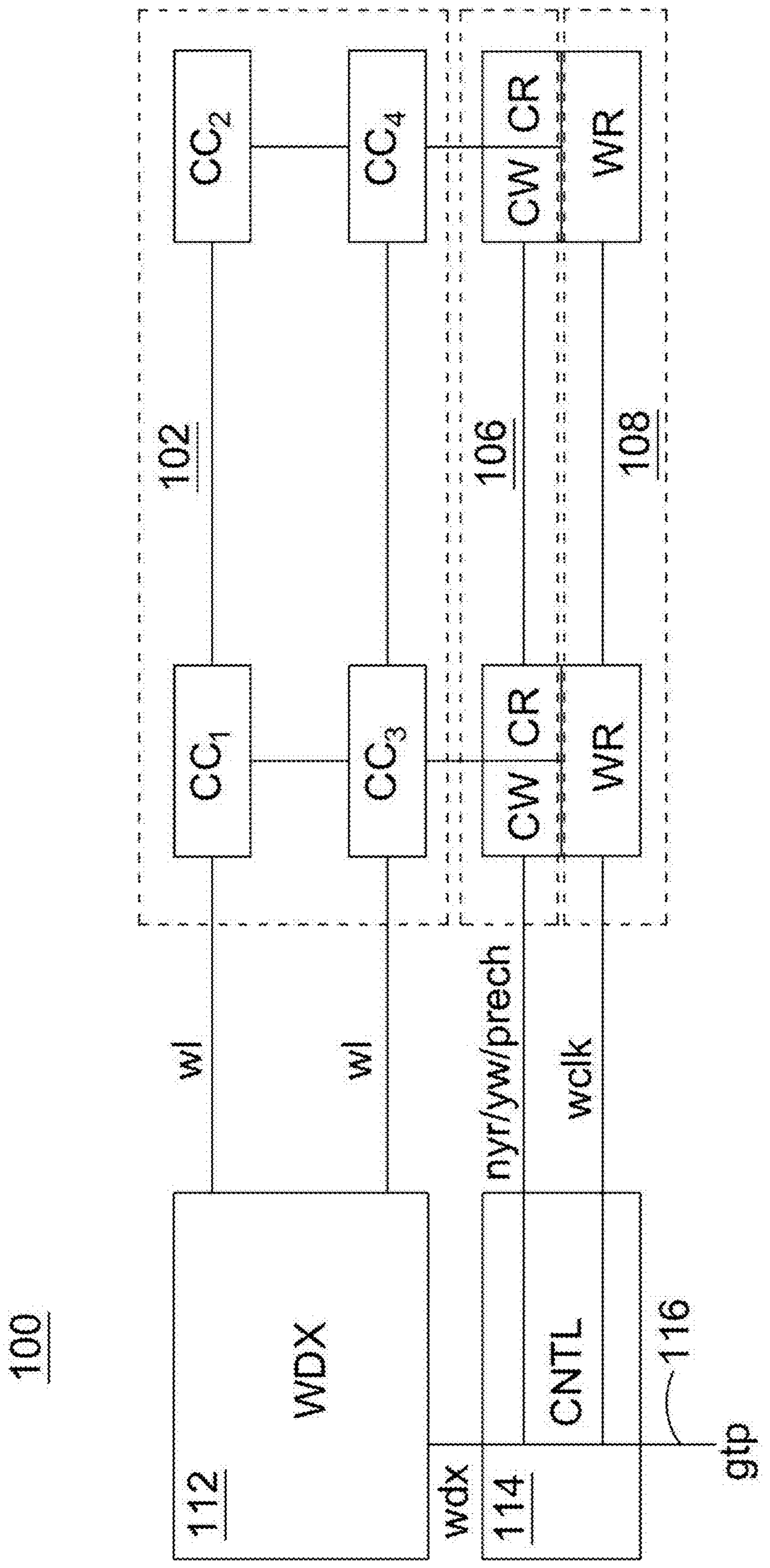
FIG. 1*a* shows a block level diagram of conventional storage circuitry.
Figure 1B:
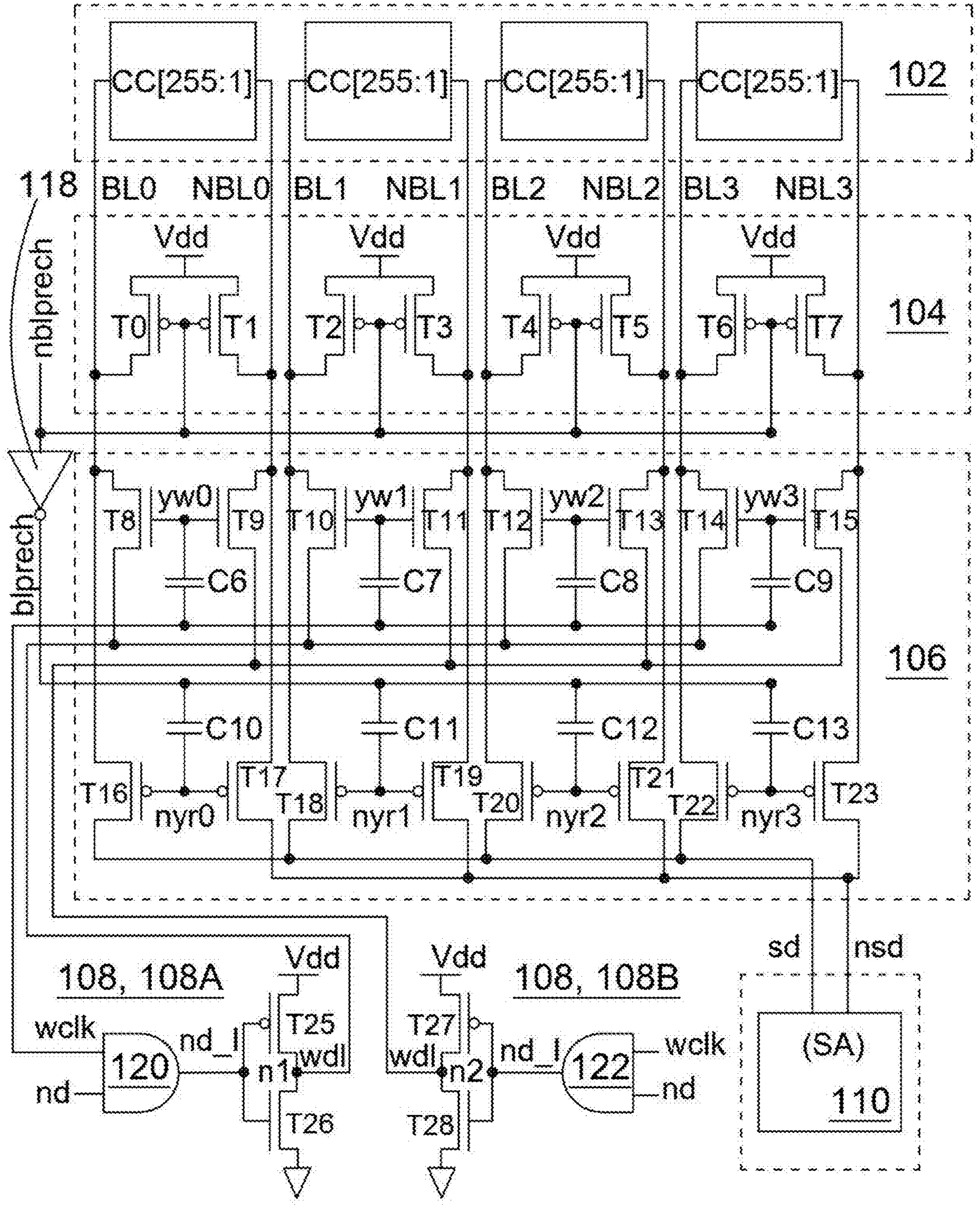
FIG. 1*b* shows a transistor level diagram of the conventional storage circuitry of FIG. 1*a;*

FIG. 1*a* shows a block level diagram of conventional storage circuitry 100 and FIG. 1*b* shows a transistor level diagram of the conventional storage circuitry 100.

The storage circuitry 100 includes various components (or elements or modules) including, e.g., core array circuitry 102, precharge circuitry 104 (not shown in FIG. 1*a*), column selection or multiplexer (Cmux) circuitry 106, write driver (WR) circuitry 108. The storage circuitry 100 also includes sense amplifier circuitry 110 (not shown in FIG. 1*a*). Further description related to the storage circuitry and the various components associated therewith are described in greater detail herein below.

The storage circuitry 100 may be implemented as an integrated circuit (IC) using various types of memory technology, such as, e.g., random access memory (RAM), including static RAM (SRAM), dynamic RAM (DRAM), and/or any other types of memory technology as will become apparent to a person skilled in the art.

In some instances, the storage circuitry 100 may be implemented as an IC with dual rail memory architecture and related circuitry. In other instances, the storage circuitry may be integrated with computing circuitry and related components on a single chip. Also, the storage circuitry 100 may be implemented in an embedded system for various electronic and mobile applications, including low power sensor nodes. In some cases, each bitcell may be implemented with random access memory (RAM) circuitry. For instance, each bitcell may include various multi-transistor static RAM (SRAM) cells, including various types of SRAM cells, such as, e.g., 6T CMOS SRAM and/or various other types of complementary MOS (CMOS) SRAM cells, such as, e.g., 2T, 4T, 8T, 10T, 12T, 14T or more transistors per bit.

The storage circuitry 100 may include the core circuitry 102 having one or more arrays ($CC_n$) of storage cells or bitcells (hereafter "bitcells") that are arranged in columns and rows. Each bitcell may be configured to store at least one data bit value (e.g., a data value related to a logical '0' or '1'). In various instances, each array ($CC_n$) of bitcells may include any number of bitcells (or bitcells) that are arranged in various applicable configurations, such as, e.g., a two-dimensional (2D) memory array having any number of columns (Ncolumns) and any number of rows (Nrows) of multiple bitcells arranged in a 2D grid pattern with 2D indexing capabilities. In embodiments the bitcells may be arranged in a 3D configuration.

In some implementations, the core circuitry 102 may be embodied as a MUX 4: 256×4 core array with one or more banks or arrays (($CC_n$)) of bitcells (or bitcells), each array $CC_n$ having 256 rows of addressable bitcells, where each bitcell may be accessed by selection of a corresponding wordline (WL) and one or more bitlines (BL).

Also, the core circuitry 102 may include wordline selection (WDX) circuitry 112 for determining which bitcell(s) is to be accessed and providing an appropriate wordline signal (WL) to the core circuitry 102. As an illustrative example, WDX circuitry 112 may comprise decoder circuitry which decodes a wordline select (wdx) signal from the control circuitry 112 to determine at least one bitcell to be accessed, and then provides an appropriate wordline signal (wl) to the core circuitry 102 via the selected wordline (WL).

Thus, the core circuitry 102 may include one or more arrays (CC) of bitcells that are accessible via at least one wordline (WL), and one or more bitlines (BL).

In some instances, the core circuitry 102 and various components thereof may operate at a source voltage supply, such as, e.g., a core supply voltage Vdd along with ground or negative (−) voltage supply Vss. In other instances, the voltage range may vary with technology.

The column multiplexer (mux) circuitry 106 includes one or more column multiplexer write devices or column write devices (CW) designated for write operations that are arranged to operate as a write multiplexer and coupled to corresponding bitlines.

In FIG. 1*b*, column multiplexer write device (CW) device is depicted as a pair of NMOS transistors (e.g. T8, T9, T10, T11, T12, T13, T14 & T15) that are arranged in parallel and coupled between corresponding bitlines (e.g. BL0, BL1, BL2, BL3 and NBL0, NBL1, NBL2, NBL3) and a write data line (WDL) to receive a write data line (wdl) signal from write driver circuitry (WR) 108. Each of the column multiplexer write devices (CW) may be activated responsive to a column select signal, such as column multiplexer write select signal (yw) (e.g., yw0, yw1, yw2, yw3 as depicted in FIG. 1*b*.)

The column multiplexer circuitry 108 includes one or more column multiplexer read devices (or column read devices) (CR) designated for read operations that are arranged to operate as a read multiplexer and are coupled to corresponding bitlines. In FIG. 1*b*, each CR device is depicted as a pair of PMOS transistors (e.g. T16, T17, T18, T19, T20, T21, T22 & T23) that are arranged in parallel and coupled between corresponding bitlines (BL) (e.g. BL0, BL1, BL2, BL3 and NBL0, NBL1, NBL2, NBL3) and a sensed data line (SD) or an inverted sensed data line (NSD) which is coupled to the output of sense amplifier (SA) circuitry 110. Each of the column multiplexer read devices (CR) may be activated responsive to a column select signal, such as column multiplexer read select signal (nyr) (e.g.: nyr0, nyr1, nyr2, nyr3 as depicted in FIG. 1*b*.)

The precharge (PRECH) circuitry 104 includes one or more precharge devices (PD). In some instances, each of the precharge devices may be activated based on a precharge control signal (nblprech). In some instances, the precharge control signal (nblprech) may be inverted (e.g. with an inverter (not shown)) to provide a bitline precharge signal (blprech), which is provided (or supplied) to the column multiplexer circuitry 108 by the control circuitry 114 (e.g. as prech signal). In FIG. 1*b*, each PC device is depicted as a pair of NMOS transistors arranged in parallel (e.g. T0, T1, T2, T3, T4, T5, T6 & T7). Further, as shown, each of the precharge devices (PC) may be coupled between the source voltage supply Vdd and a corresponding bitline.

The write driver (WR) circuitry 108 may be part of the column mux circuitry 106, and may comprise at least one write driver (two of which are depicted in FIG. 1*b*).

As illustratively shown in FIG. 1*b*, first write driver 108A and a second write driver 108B each include a NAND gate 120/122 and an inverter having a PMOS transistor T25/T27 and an NMOS transistor T26/T28 where transistors of the respective write drivers 108A/108B are coupled between source voltage levels (e.g. Vdd and Vss).

The write drivers 108A/108B include an output at node n1/n2 that are coupled to respective column mux write devices. Also, the NAND gates 120/122 each receives a write clock signal (wclk) and data signal (nd) as inputs and provides an output signal (nd_1) to gates of the transistors T25/T27, T26/T28. As also shown, the invertor arrangement of transistors T25, T26 provide a write data line (wdl) signal as the output from the first write driver 108A at node n1 to the column mux devices T8, T10, T12, T14 and the invertor arrangement of transistors T27, T28 provide a write data line (wdl) signal as the output from the second write driver 108B at node n2 to the column mux devices T9, T11, T13, T15.

Thus, the column write mux devices T8, T10, T12, T14 are coupled to corresponding bitlines (BL0, BL1, BL2, BL3) between the bitcells in storage arrays ($CC_n$) and the first write driver 108A. Further, the column mux write devices T9, T11, T13, T15 are coupled to corresponding bitlines (NBL0, NBL1, NBL2, NBL3) between the bitcells in storage arrays ($CC_n$) and the second write driver 108B.

As shown in FIG. 1*a*, the sense amplifier circuitry 110 (SA) provides multiple output signals, such as, e.g., the sensed data signal (sa) as a first output signal and a complementary sensed data signal (nsd) as a second output signal. As shown, the first output signal line (sd) from the sense amplifier circuitry 110 (SA) is coupled to the column mux devices T16, T18, T20, T22, and the second output signal line (nsd) from the sense amplifier circuitry 110 (SA) is coupled to the column mux read devices (CR) T17, T19, T21, T23. As such, the column mux read devices T16, T18, T20, T22 are coupled to corresponding bitlines (BL0, BL1, BL2, BL3) between the bitcells in storage arrays ($CC_n$) and the sense amplifier circuitry 110 (SA), and the column mux read devices T17, T19, T21, T23 are coupled to corresponding bitlines (NBL0, NBL1, NBL2, NBL3) between the bitcells in storage arrays ($CC_n$) and the sense amplifier (SA) circuitry 110. The storage circuitry 100 may include the sense amplifier (SA) circuitry 110, e.g., as part of the column mux circuitry 106.

Column multiplexer write select signal (yw) which comprises a transition signal is provided to control the column mux write devices (CW) to, for example, couple/decouple (or connect/disconnect) a selected bitline to/from the write driver circuitry 108 by controlling a respective the column mux write device (CW) during a write operation.

Column multiplexer write select signal (nyr) which comprises a further transition signal is provided to control the column mux read devices (CR) to, for example, couple/decouple (or connect/disconnect) a selected bitline to/from the sense amplifier circuitry 110 by controlling a respective column mux read device (CR) during a read operation.

The storage circuitry 100 may include clock generation circuitry (not shown) that may receive a clock signal (clk) (e.g. an external clock signal) and, responsive to the external clock signal may provide an internal clock signal (depicted in FIG. 1*a* as a global timing pulse (gtp) signal) to the various circuitry to initiate a particular read or write operation.

As depicted in FIG. 1*a*, control circuitry 114 receives the gtp signal via input signal line 116 and, responsive to the gtp signal, provides various signals to wdx circuitry 112, precharge circuitry 104, column multiplexer circuitry 106 and WR circuitry 108 to control the read/write operations.

For example, the control circuitry 114 provides, responsive to the gtp signal, wdx signal(s) to the WDX circuitry 112 which, responsive to the wdx signals(s) (e.g. upon decoding the wdx signal(s)), provides more one or more worldline signals (wl) to the core circuitry 102 to select one or more wordlines to access one or more bitcells.

As a further example the control circuitry 114 provides, responsive to the gtp signal, the nyr/yw/prech signals to the column multiplexer circuitry 106 and also provides the welk signal to the word driver circuitry 108 to select one or more column mux read device (CR) or one or more column mux write device to access one or more bitcells via one or more bitlines (BL/NBL).

Figure 2:
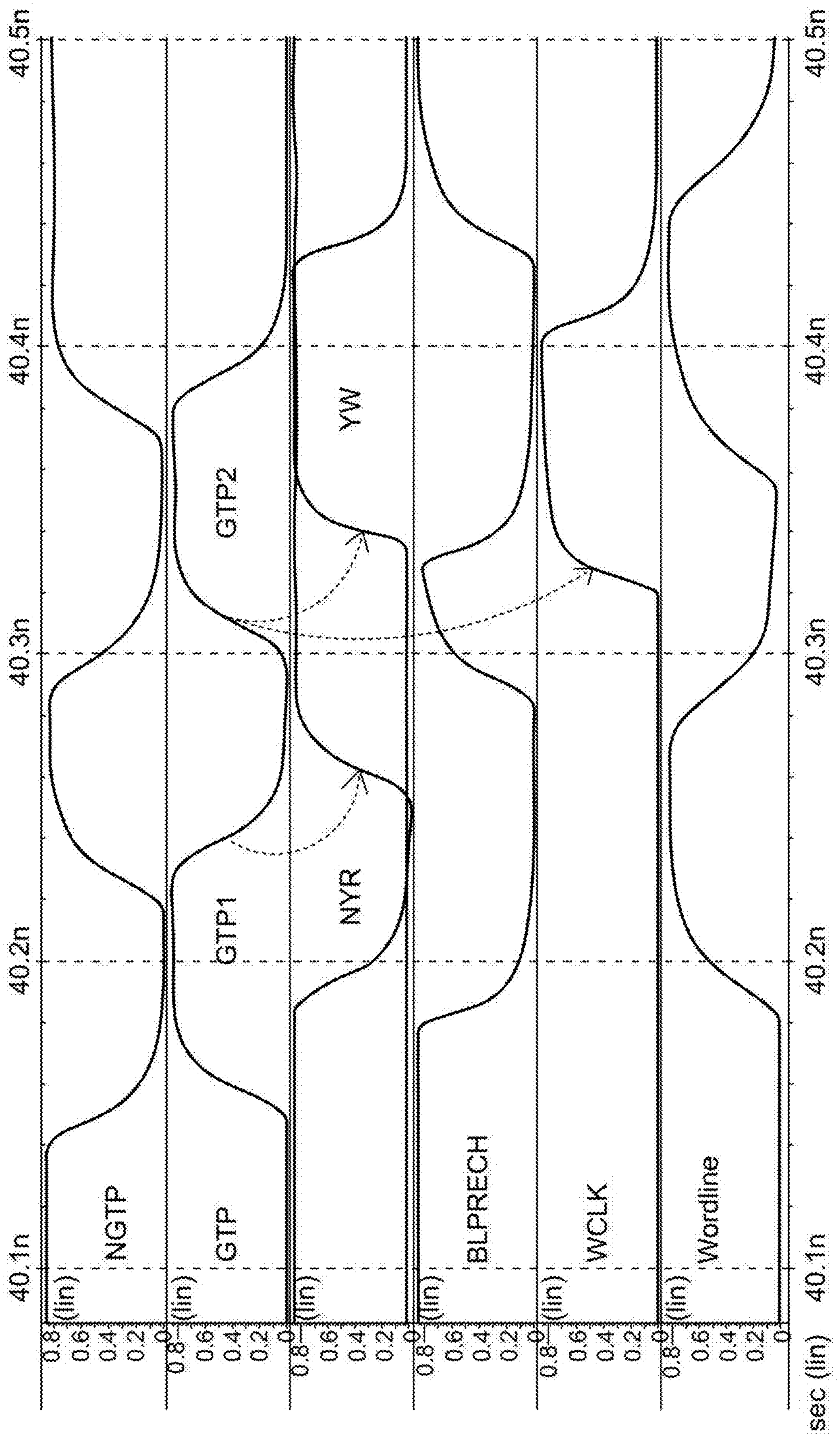
FIG. 2 shows a waveform diagram of a read and write operation in the conventional storage circuitry of FIG. 1*a;*

As will be appreciated, the timing of the various signals is important to achieve successful read and write operations and FIG. 2 shows a waveform diagram of a read and write operation performed at the storage circuitry 100.

As depicted in FIG. 2, the rising edge of the first pulse (gtp1) of the gtp signal triggers the start of the read operation (where column multiplexer read select signal (nyr) transitions from HIGH to LOW to control a corresponding column mux read device to couple a selected bitline(s) to the sense amplifier circuitry).

The appropriate wordline signal (wl) is triggered to access the selected bitcell(s) to be read during the read operation (i.e. to read a data value from the selected bitcell(s)), where the control circuitry 114 provides, responsive to the gtp signal, wdx signal(s) to the WDX circuitry 112 to trigger the wordline signal during the read operation.

The falling edge of the gtp1 pulse triggers the end of the read operation (where column multiplexer read select signal (nyr) transitions from LOW to HIGH to control the corresponding column mux read device to decouple the associated bitline (BL) from the sense amplifier circuitry).

As also depicted in FIG. 2, the rising edge of the second gtp pulse (gtp2) of the gtp signal triggers the start of the write operation (where column multiplexer write select signal (yw) transitions from LOW to HIGH and the welk signal transitions from LOW to HIGH) responsive to the rising edge of gtp2.

The appropriate wordline signal (wl) is triggered to access the bitcell(s) to be written to during the write operation (i.e. to write a data value to the accessed bitcell(s)), where the control circuitry provides, responsive to the gtp signal, wdx signal(s) to the WDX circuitry 112 to trigger the worldline signal (wl) during the write operation. The desired data to be written is driven into the bitlines (BL/NBL) from the word driver circuitry via the connected column mux write devices when the wordline is HIGH (e.g. as depicted by the bl/nbl split during the write operation in FIG. 4*b*).

The falling edge of the gtp2 pulse triggers the end of the write operation (where column multiplexer write select signal (yw) transitions from HIGH to LOW and the wclk signal transitions from HIGH to LOW).

Thus, it will be seen that different pulses of the same control signal (i.e. gtp signal) trigger both the read and write operations.

The read operation should be completed before the write operation begins, and the length of time between the falling edge of the first gtp pulse (gtp1) (that signals the end of the read operation) and the rising edge of a successive gtp pulse (gtp2) (that signals the start the write operation) is to guarantee that the read operation is completed before the write operation begins. Thus a write delay ($\Delta t$) in respect of the time (t) between successive gtp pulses can be enforced to ensure that that write operation starts only after the read operation completes. The write delay may decrease the achievable total clock cycle ($t_{cyc}$) for the read and write operation.

Figure 3:
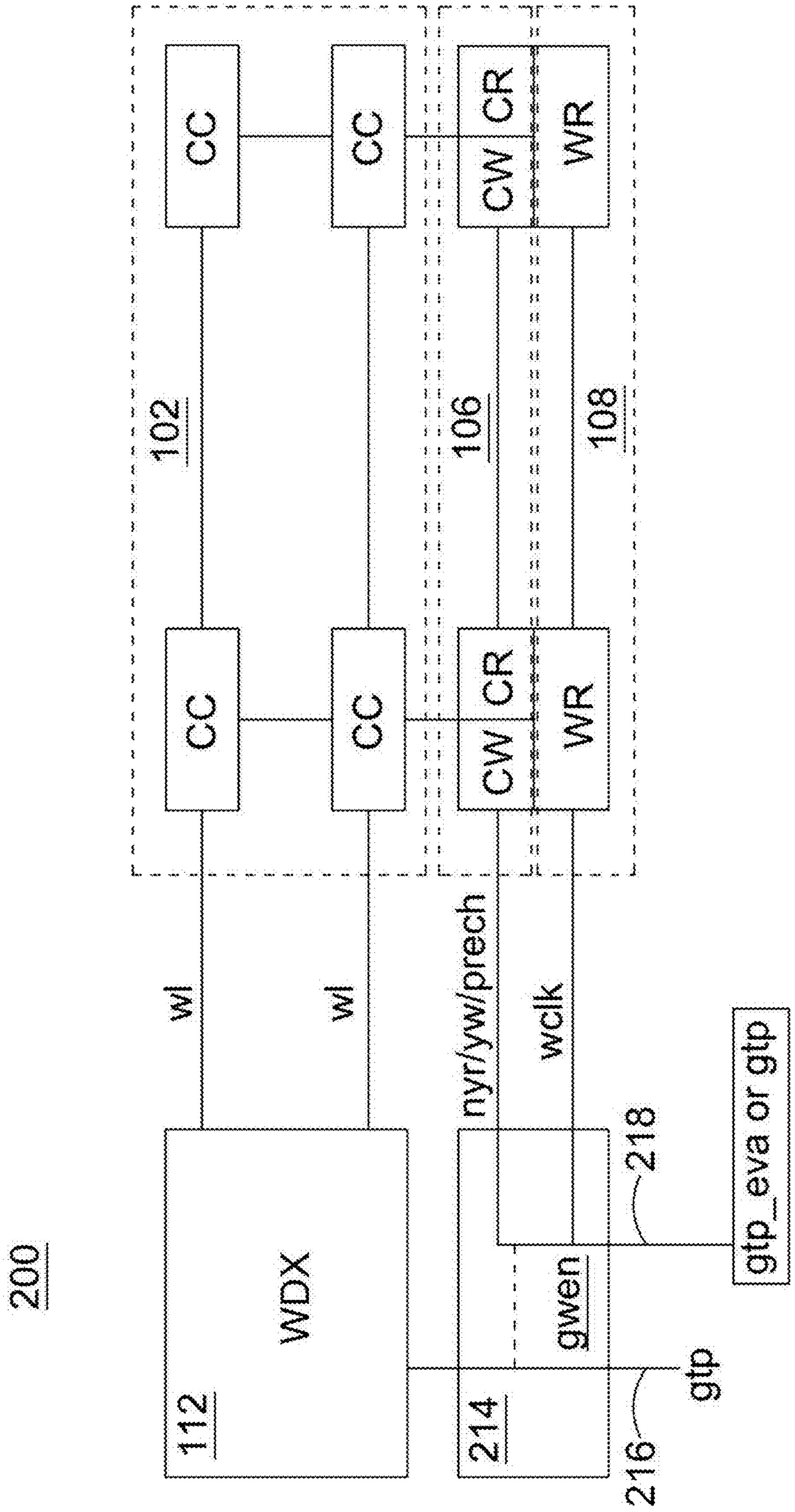
FIG. 3 shows a block level diagram of storage circuitry in accordance with the present techniques.

FIG. 3 shows a block level diagram of storage circuitry 200 in accordance with the present techniques. Similar feature numbers will be used to describe like features as above in FIG. 1*a*.

As with the storage circuitry of FIGS. 1*a* & 1*b* the storage circuitry 200 may comprise: core array circuitry 102, precharge circuitry 104, column multiplexer circuitry 106, WR circuitry 108 and WDX circuitry 112. The storage circuitry 200 also comprises control circuitry 214 which may be configured to perform read and write operations in a similar manner as described above, where different pulses of the same control signal (i.e. gtp signal) trigger both the read and write operations.

However, the storage circuitry 200 is also operable to perform improved read and write operations in accordance with the present techniques.

As depicted in FIG. 3, the control circuitry 214 can operate in a first "GTP mode" or "gtpeva_disabled" mode.

In GTP mode the control circuitry 214 may receive the gtp signal via both the first input signal line 216 and second input signal line 218. In embodiments, the control circuitry 214 provides, responsive to the gtp signal received via the first input signal line 216, wdx signal(s) to the WDX circuitry 112, where the wdx signal(s) trigger one or more worldline signals (wl) to access a selected bitcell(s) during the read or write operation.

In the GTP mode the control circuitry 214 also, responsive to the gtp signal received via the second input signal line 218, provides the nyr/yw/prech and welk signals to the column multiplexer circuitry 106 and WR circuitry 108.

In accordance with the present techniques, the control circuitry 214 can also operate in a second GTPEVA mode or "gtpeva_enabled" mode.

In GTPEVA mode the control circuitry 214 provides, responsive to the gtp signal received via the first input signal line 216, wdx signal(s) to the WDX circuitry 112 in a similar manner as described above in respect of the conventional techniques.

In GTPEVA mode the control circuitry 214 receives, via the second input line 218, a further control signal (gtp_eva), where, in an embodiment, the length of the gtp_eva signal received via the second input signal line 218 is substantially the same length as the total length of two gtp pulses in the gtp signal received via the first input signal line 216. However the claims are not limited in this respect and the gtp_eva signal may be any suitable length as will be apparent to a person of skill in the art.

In GTPEVA mode, the gtp_eva signal may be provided to the control circuitry 214 via the second input signal line 218 when a pin (e.g. EVA pin) is set to a particular value (e.g.

HIGH), or when a register (EVA register) stores a particular value (e.g. 1), or when a flag (e.g. EVA flag) has a particular value (e.g. set).

In GTP mode, the gtp signal may be provided to the control circuitry 214 via the second input signal line 218 when a pin (e.g. EVA pin) is set to a particular value (e.g. LOW), or a register (EVA register) stores a particular value (e.g. 0), or when a flag (e.g. EVA flag) has a particular value (e.g. unset). As depicted by the dashed line in FIG. 3, in GTP MODE the gtp signal may be used to trigger the nyr, yw, prech and wlck signals.

In GTPEVA mode (i.e. when gtp_eva signal is asserted at the second signal line) a further control signal (hereafter "global write enable" (gwen) signal) is generated (e.g. by the control circuitry 214) responsive to the gtp signal received via the first signal line 216. As an illustrative example, the gtp signal may be used to control a GWEN latch (not shown) to generate the gwen signal.

In embodiments the gwen signal is set to HIGH during a read operation and is set to LOW during a write operation. In an illustrative example, in GTPEVA mode the gwen signal controls the end of the read operation and start of the write operation responsive to the fall of the first gtp pulse of the gtp signal. For example, the gwen signal may be used to trigger the nyr, yw, and wlck signals.

Figure 4A:
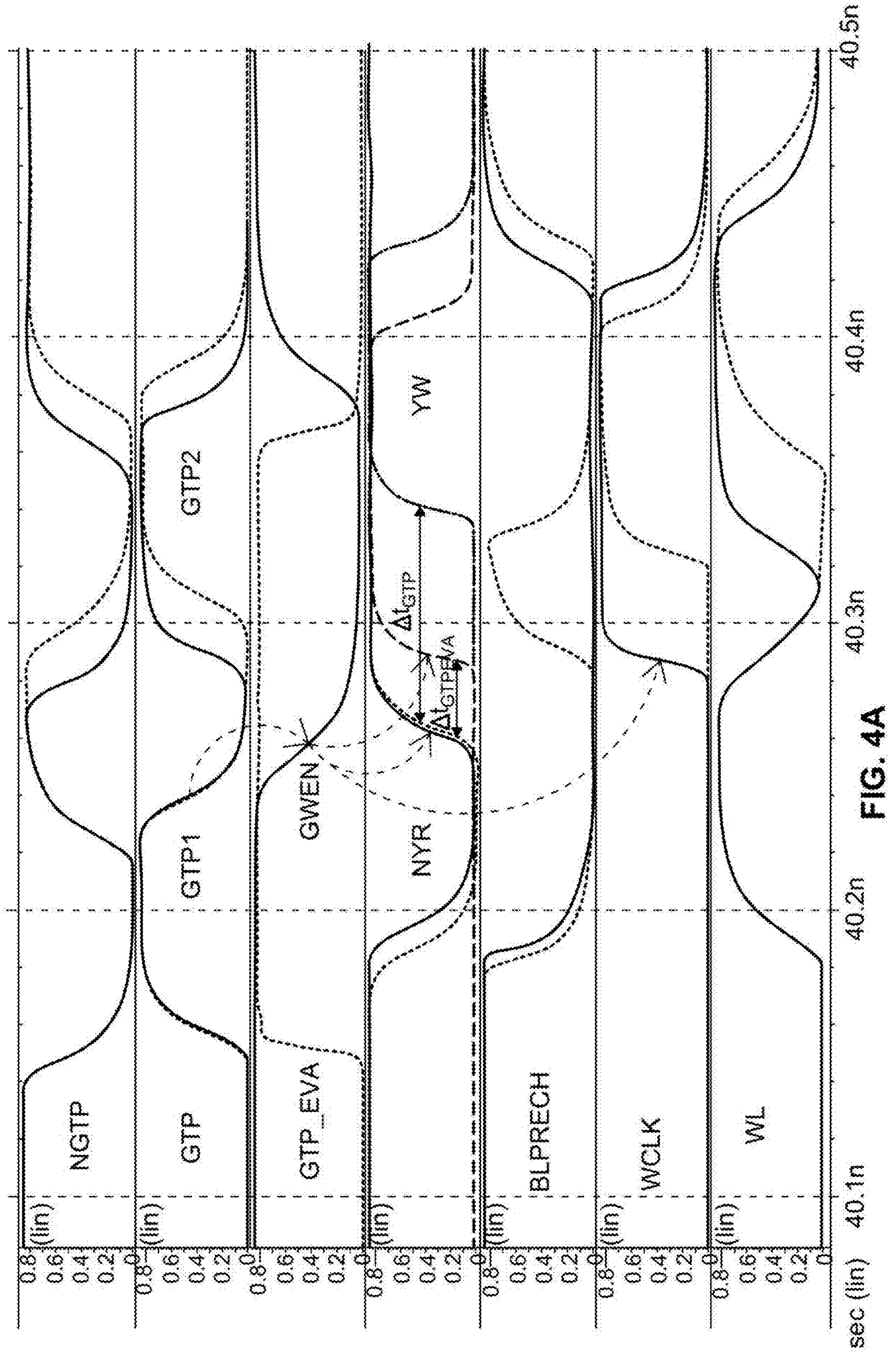
FIG. 4*a* shows a waveform diagram of a read and write operation in the storage circuitry of FIG. 3.
Figure 4B:
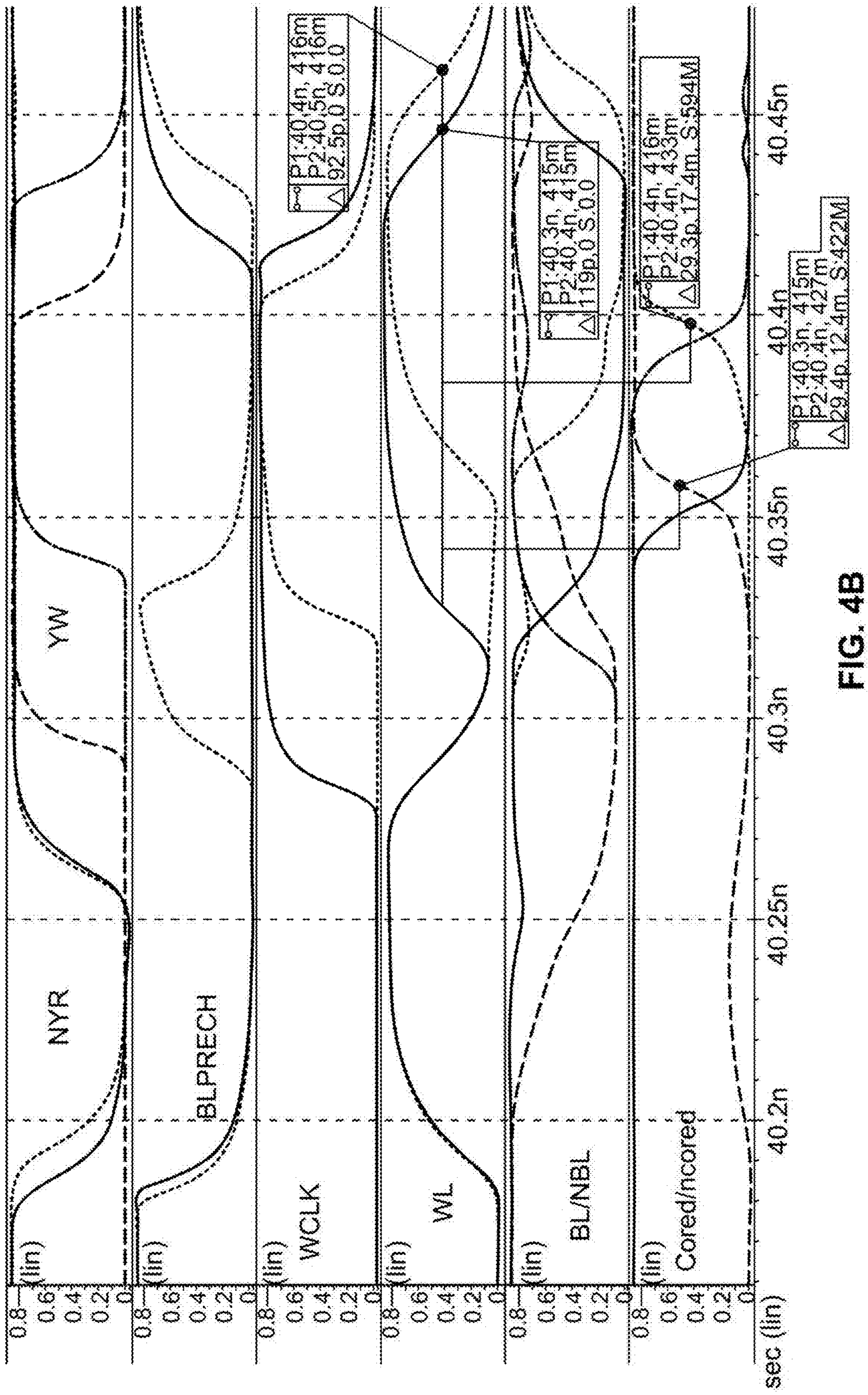
FIG. 4*b* shows an additional waveform diagram of the read and write operation of FIG. 4*a;*

FIG. 4*a* shows a waveform diagram of a read and write operation performed at the storage circuitry 200 and FIG. 4*b* shows a waveform diagram which is a continuation of the read and write operation of FIG. 4*a* and depicts the nyr, yw, blprech, wclk and wl signals also depicted in FIG. 4*a*, but also shows bitline signals (bl/nbl), which depict the state of the selected bitlines and and cored and ncored signals which depict the the state of the selected bitcell of the bitcell array.

The signals emphasised in the bold lines (or thick lines) in FIGS. 4*a* and 4*b* depict signals of the read and write operation during GTPEVA mode, whilst the non-bold lines (or thin lines) depict signals of the read and write operation during GTP mode.

As depicted in FIG. 4*a*, in GTPEVA mode (i.e. when gtp_eva is HIGH), and when gwen is HIGH, the rising edge of the first pulse (gtp1) of the gtp signal triggers the start of the read operation (where column multiplexer read select signal (nyr) transitions from HIGH to LOW). The appropriate wordline signal (wl) can be asserted to access the selected bitcell(s) to be read during the read operation (i.e. to read a data value) responsive to the bl/nbl values. The falling edge of the gtp1 pulse triggers the gwen signal to transition from HIGH to LOW which signals the end of the read operation and triggers multiplexer read select signal (nyr) to transition from LOW to HIGH.

In embodiments, a signal from the sense amplifier circuitry may be used in addition to gwen to signal the end of the read operation. For example, when a data value is successfully read during the read operation, the sense amplifier circuitry (not shown in FIG. 3) may output a signal (not shown in FIG. 4*a* or 4*b*), which in addition to the gwen signal triggers the transition of nyr from LOW to HIGH.

As also depicted in FIG. 4*a*, the gwen transition from HIGH to LOW also signals the start of the write operation (e.g. where column multiplexer write select signal (yw) transitions from LOW to HIGH and where the welk signal transitions from LOW to HIGH responsive to the gwen signal). As will be seen, this differs from the read and write operation depicted in FIG. 2, where the rising edge of the second gtp pulse triggers the write operation.

In GTPEVA mode, write delay ($\Delta t_{GTPEVA}$) comprises a pre-defined delay which is set with respect to the gwen signal, such that the write operation will start after a predefined delay following the gwen transition to signal the end of the read operation to ensure that the write operation starts after the read operation fully completes. The pre-defined delay may be set dependent on technology (e.g. the width of the transistors), and which may be determined during the design or testing phase post-manufacture. As illustratively shown in FIGS. 4*a* & 4*b*, the write delay $\Delta t_{GTPEVA}$ in GTPEVA mode is improved (reduced) compared to the write delay $\Delta t_{GTP}$ in GTP mode.

The appropriate wordline signal (wl) can be asserted to access the bitcell(s) to be written during the write operation, and the data value written to the accessed bitcell responsive a signal from the word driver circuitry 108.

The falling edge of the gtp2 pulse triggers the transition of the gwen signal from LOW to HIGH, thereby signalling the end of the write operation (where the gwen transition from LOW to HIGH triggers column multiplexer write select signal (yw) to transition from HIGH to LOW and also triggers the welk signal to transition from HIGH to LOW.

As can be seen in FIGS. 4*a* and 4*b*, controlling the transition between read and write operations responsive to the gwen signal (i.e. in GTPEVA mode) rather than responsive to a gtp pulse as required in the GTP mode provides for beginning the write operation earlier than is achievable in GTP mode where, in GTP mode, the start of the write operation is triggered by the rising edge of a gtp pulse of the gtp signal, thereby providing a much improved write margin (>25%) for GTPEVA mode compared to GTP mode.

By triggering the yw signal earlier, the bitline signal (bl/nbl) can be split earlier, and the write operation can be ended earlier. Thus, the read and write operation is completed quicker in GTPEVA mode compared to GTP mode. Thus, the next (subsequent) read operation can be started earlier than would be achievable in GTP mode (e.g. the next pulse in the gtp signal can be passed earlier to initiate the next read operation). Therefore the clock cycle time ($t_{cyc}$) for the EVA read and write operation will be improved for GTPEVA mode compared to GTP mode.

Furthermore, given it is the gwen signal that controls the end of the read operation and the start of the write operation and not the falling and rising edges of consecutive gtp pulses, the requirement to add a write delay ($\Delta t$) dependent on the two GTP pulses is negated. Thus, the falling edge of the gtp pulse that controls the end of the write operation can be initiated responsive to a signal (e.g. from the word driver circuitry) that the data value is written to the bitcell, thereby increasing the overall frequency of the read and write operations.

Looking at the non-bold signals of FIGS. 4*a* & 4*b*, in GTP mode the bitline is precharged between a read operation and write operation and discharged by the write driver circuitry (e.g. responsive to the gtp pulse transitioning from LOW to HIGH as depicted by blprech signal).

However, in GTPEVA mode, the write operation is not started responsive to the second gtp pulse (and may be performed prior to the gtp pulse), so precharging of the bitline is not performed between the read and write operations (i.e. the precharge circuitry is not activated between the read and write operations). Such functionality in accordance with the present techniques, where the bitline is not precharged between read and write operations, provides for a power saving compared to the functionality in GTP mode where the bitline is precharged between read and write operations.

Figure 5:
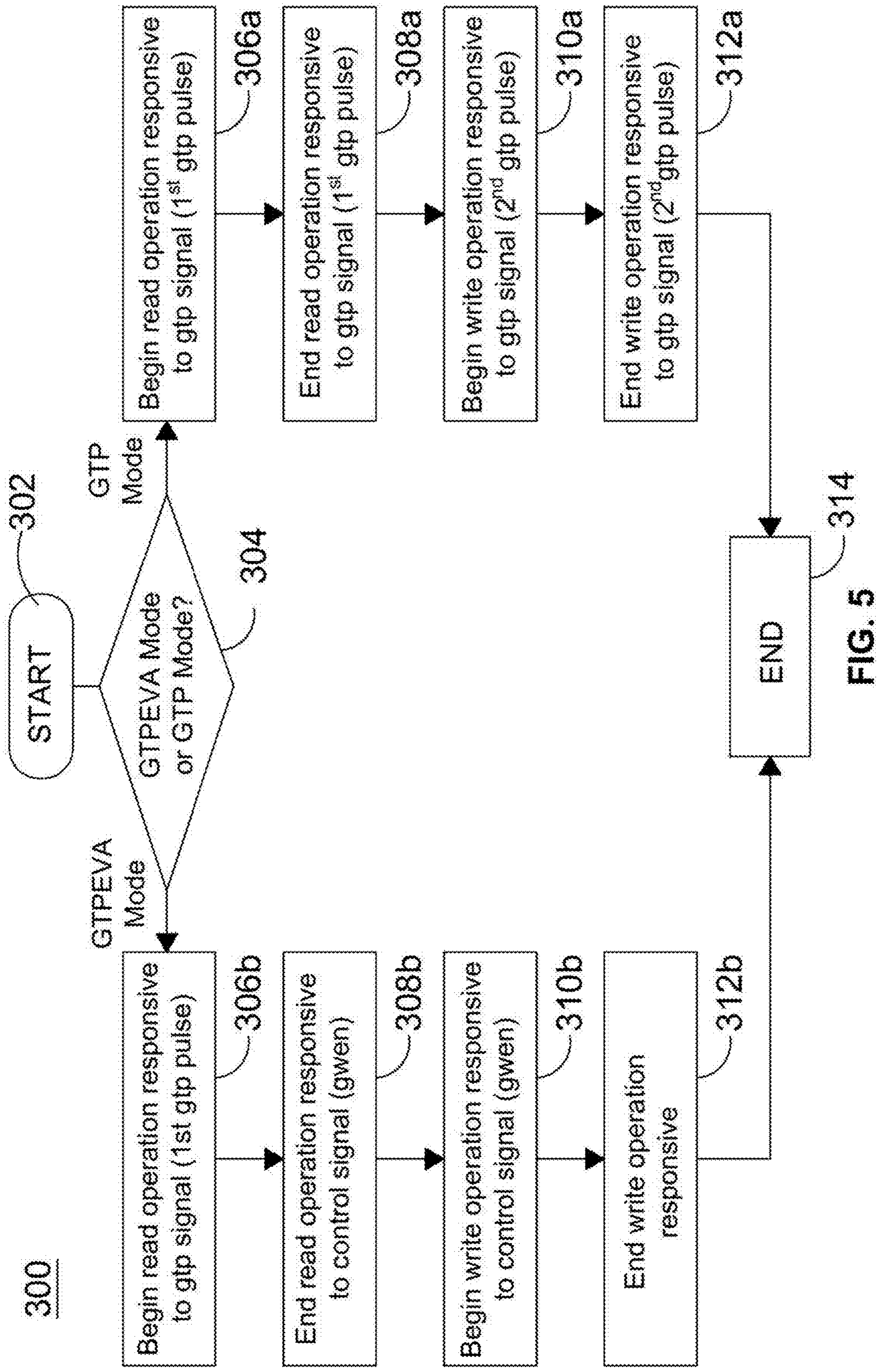
FIG. 5 shows a flow diagram illustratively showing example storage operations in the storage circuitry of FIG. 3.

FIG. 5 illustratively showing a flow diagram 300 of a read and write operation in storage circuitry.

At 302 the method starts.

At 304 it is determined whether not the storage circuitry is to operate in GTP mode or GTPEVA mode. Such a determination may be made, for example, dependent on a value of a pin (e.g. an EVA pin), a flag (e.g. an EVA flag) or storage in a register (e.g. an EVA register).

At 306*a*, when the storage circuit is set to operate in GTP mode, a read operation is initiated at control circuitry responsive to the rising edge of a first pulse of a control signal (i.e. gtp signal) and at 308*a* the falling edge of the first pulse of the same control signal triggers the end of the read operation.

At 310*a* a second pulse of the same control signal (i.e. gtp signal) triggers the start of the write operation (e.g. responsive to a rising edge of the second pulse). At 312*a*, the second pulse of the same control signal triggers the end of the write operation (e.g. responsive to a falling edge of the second pulse).

The appropriate wordline signal (wl) can be asserted to access the bitcell(s) to be written during the respective read or write operations (i.e. to read or write a data value from a selected bitcell).

Thus, in GTP mode, it will be seen that different pulses of the same control signal (i.e. gtp signal) trigger both the read and write operations.

At 306*b*, when the storage circuit is set to operate in GTPEVA mode, a read operation is initiated at control circuitry responsive to the rising edge of a first pulse of a first control signal (i.e. gtp signal) and at 308*b*, when a second control signal (the gwen signal) is HIGH, the falling edge of the first pulse of the first control signal triggers the end of the read operation and triggers the second control signal to transition from HIGH to LOW.

At S310*b* the second control signal transitions from HIGH to LOW to signal the start of the write operation where the second control signal transitioning from HIGH to LOW triggers column multiplexer write select signal (yw) to transition from LOW to HIGH and also triggers the welk signal to transition from LOW to HIGH.

In embodiments the length of time or delay (Δt) between the end of the read operation and the start of the write operation may set dependent on the technology used (e.g. the width of the transistors), and an appropriate Δt to avoid any overlap between the end of the read operation and start of the write operation as signalled by the second control signal transitioning from HIGH to LOW may be determined during the design phase or during a characterisation phase.

At S312*b*, the falling edge of the second pulse of the control signal triggers the second control signal to transition from LOW to HIGH which signals the end of the write operation, where the second control signal transitioning from LOW to HIGH triggers column multiplexer write select signal (yw) to transition from HIGH to LOW and also triggers the welk signal to transition from HIGH to LOW.

As will be seen, the read and write operation in GTPEVA mode, the end of the read operation and start of the write operation are controlled responsive to the second control signal which differs from GTP mode, where the end of the read operation and start of the write operation are controlled responsive to different pulses in the same control signal.

Thus, the write operation can be completed quicker in GTPEVA mode compared to GTP mode and a next (subsequent) read operation can be started earlier in GTPEVA mode than would be achievable in GTP mode (e.g. the next pulse in the gtp signal can be passed earlier to initiate the next read operation).

As will be apparent, the read and write operation performed in GTP mode and GTPEVA mode is an eviction and allocation (EVA) operation in EVA or double pump storage. The present techniques described above, provide for improving the speed of a read and write operation in such EVA storage, and also provides for reducing the power required to perform such read and write operations in such EVA storage. Such EVA storage may be a high speed EVA Fast Cache Instance (FCI) for a CPU (for example).

Concepts described herein may be embodied in computer-readable code for fabrication of an apparatus that embodies the described concepts. For example, the computer-readable code can be used at one or more stages of a semiconductor design and fabrication process, including an electronic design automation (EDA) stage, to fabricate an integrated circuit comprising the apparatus embodying the concepts. The above computer-readable code may additionally or alternatively enable the definition, modelling, simulation, verification and/or testing of an apparatus embodying the concepts described herein.

For example, the computer-readable code for fabrication of an apparatus embodying the concepts described herein can be embodied in code defining a hardware description language (HDL) representation of the concepts. For example, the code may define a register-transfer-level (RTL) abstraction of one or more logic circuits for defining an apparatus embodying the concepts. The code may define an HDL representation of the one or more logic circuits embodying the apparatus in Verilog, System Verilog, Chisel, or VHDL (Very High-Speed Integrated Circuit Hardware Description Language) as well as intermediate representations such as FIRRTL. Computer-readable code may provide definitions embodying the concept using system-level modelling languages such as SystemC and System Verilog or other behavioural representations of the concepts that can be interpreted by a computer to enable simulation, functional and/or formal verification, and testing of the concepts.

Additionally, or alternatively, the computer-readable code may define a low-level description of integrated circuit components that embody concepts described herein, such as one or more netlists or integrated circuit layout definitions, including representations such as GDSII. The one or more netlists or other computer-readable representation of integrated circuit components may be generated by applying one or more logic synthesis processes to an RTL representation to generate definitions for use in fabrication of an apparatus embodying the invention. Alternatively, or additionally, the one or more logic synthesis processes can generate from the computer-readable code a bitstream to be loaded into a field programmable gate array (FPGA) to configure the FPGA to embody the described concepts. The FPGA may be deployed for the purposes of verification and test of the concepts prior to fabrication in an integrated circuit or the FPGA may be deployed in a product directly.

The computer-readable code may comprise a mix of code representations for fabrication of an apparatus, for example including a mix of one or more of an RTL representation, a netlist representation, or another computer-readable definition to be used in a semiconductor design and fabrication process to fabricate an apparatus embodying the invention. Alternatively, or additionally, the concept may be defined in a combination of a computer-readable definition to be used in a semiconductor design and fabrication process to fabricate an apparatus and computer-readable code defining instructions which are to be executed by the defined apparatus once fabricated.

Such computer-readable code can be disposed in any known transitory computer-readable medium (such as wired or wireless transmission of code over a network) or non-transitory computer-readable medium such as semiconductor, magnetic disk, or optical disc. An integrated circuit fabricated using the computer-readable code may comprise components such as one or more of a central processing unit, graphics processing unit, neural processing unit, digital signal processor or other components that individually or collectively embody the concept.

Implementations of the present technology each have at least one of the above-mentioned objects and/or aspects, but do not necessarily have all of them. It should be understood that some aspects of the present technology that have resulted from attempting to attain the above-mentioned object may not satisfy this object and/or may satisfy other objects not specifically recited herein.

The functions of the various elements shown in the figures, including any functional elements labeled as a "block," "module" or "processor", may be provided through the use of dedicated hardware as well as hardware capable of executing software in association with appropriate software. When provided by a processor, the functions may be provided by a single dedicated processor, by a single shared processor, or by a plurality of individual processors, some of which may be shared. Moreover, explicit use of the term "processor" or "controller" should not be construed to refer exclusively to hardware capable of executing software, and may implicitly include, without limitation, digital signal processor (DSP) hardware, network processor, application specific integrated circuit (ASIC), field programmable gate array (FPGA), read-only memory (ROM) for storing software, random access memory (RAM), and non-volatile storage. Other hardware, conventional and/or custom, may also be included.

Software modules, or simply modules which are implied to be software, may be represented herein as any combination of flowchart elements or other elements indicating performance of process steps and/or textual description. Such modules may be executed by hardware that is expressly or implicitly shown.

Additional and/or alternative features, aspects and advantages of implementations of the present technology will become apparent from the following description, the accompanying drawings and the appended claims.

The examples and conditional language recited herein are intended to aid the reader in understanding the principles of the present technology and not to limit its scope to such specifically recited examples and conditions. It will be appreciated that those skilled in the art may devise various arrangements which, although not explicitly described or shown herein, nonetheless embody the principles of the present technology and are included within its scope as defined by the appended claims.

Furthermore, as an aid to understanding, the above description may describe relatively simplified implementations of the present technology. As persons skilled in the art would understand, various implementations of the present technology may be of a greater complexity.

In some cases, what are believed to be helpful examples of modifications to the present technology may also be set forth. This is done merely as an aid to understanding, and, again, not to limit the scope or set forth the bounds of the present technology. These modifications are not an exhaustive list, and a person skilled in the art may make other modifications while nonetheless remaining within the scope of the present technology. Further, where no examples of modifications have been set forth, it should not be interpreted that no modifications are possible and/or that what is described is the sole manner of implementing that element of the present technology.

Moreover, all statements herein reciting principles, aspects, and implementations of the technology, as well as specific examples thereof, are intended to encompass both structural and functional equivalents thereof, whether they are currently known or developed in the future. Thus, for example, it will be appreciated by those skilled in the art that any block diagrams herein represent conceptual views of illustrative circuitry embodying the principles of the present technology. Similarly, it will be appreciated that any flowcharts, flow diagrams, state transition diagrams, pseudo-code, and the like represent various processes which may be substantially represented in computer-readable media and so executed by a computer or processor, whether or not such computer or processor is explicitly shown.

It will be clear to one skilled in the art that many improvements and modifications can be made to the foregoing exemplary embodiments without departing from the scope of the present techniques.

The invention claimed is:

1. A storage device comprising:

core circuitry comprising one or more bitcells, each bitcell accessible via a corresponding bitline and wordline;

column selection circuitry to, responsive to a column select signal, select at least one bitcell via one or more bitlines;

wordline selection circuitry to, responsive to a wordline select signal, select the at least one bitcell via one or more wordlines;

control circuitry to, in a first mode of operation:

provide a first wordline select signal to the wordline selection circuitry responsive to a first control signal;

provide first and second column select signals to the column selection circuitry responsive to a second control signal, and wherein:

the first column select signal is to control a read operation and the second column select signal is to control a write operation, a transition of the second control signal triggers the read operation to complete and simultaneously triggers the write operation to begin.

2. The storage device of claim 1, where the control circuitry is to, in a second mode of operation:

provide a second wordline select signal to the wordline selection circuitry responsive to the first control signal;

provide third and fourth column select signals to the column selection circuitry responsive to the first control signal, and where the third column select signal is to control a read operation and where the fourth column select signal is to control a write operation.

3. The storage device of claim 1, where the first control signal comprises a first global timing signal comprising two or more pulses.

4. The storage device of claim 1, where the second control signal is generated responsive to the first control signal.

5. The storage device of claim 4, where the second control signal is generated responsive to a third control signal being asserted.

6. The storage device of claim 4, where the first control signal is received at a first input of the control circuitry and where the third control signal is received at a second input of the control circuitry.

7. The storage device of claim 1, where the write operation is to start after a pre-defined delay following the first column select signal.

8. The storage device of claim 1, where the column selection circuitry comprises one or more column read devices and where the first column select signal is to enable a first column read device to couple a bitline to sense amplifier circuitry.

9. The storage device of claim 1, where the column selection circuitry comprises one or more column write devices and where the second column select signal is to enable a first column write device to couple a bitline to write driver circuitry.

10. The storage device of claim 1, further comprising precharge circuitry to precharge a bitline.

11. The storage device of claim 10, where the precharge circuitry is not activated between a read operation and a write operation in the first mode of operation.

12. The storage device of claim 1, where the first control signal comprises two clock pulses and where the third control signal comprises a single pulse having a length substantially similar to the total length of the two clock pulses of the first control signal.

13. The storage device of claim 1, where the read and write operation comprises an eviction and allocation operation.

14. A non-transitory computer-readable medium to store computer-readable code for fabrication of the storage device of claim 1.

15. A method of controlling a read operation and a write operation at a storage device, the storage device having:

core circuitry comprising one or more bitcells, each bitcell accessible via a corresponding bitline and wordline;

column selection circuitry to, responsive to a column select signal, select at least one bitcell via one or more bitlines;

wordline selection circuitry to, responsive to a wordline select signal, select the at least one bitcell via one or more wordlines; and control circuitry to operate in a first mode or second mode, the method comprising:

providing, from the control circuitry operating in the first mode to the wordline selection circuitry, a first wordline select signal responsive to a first control signal;

providing, from the control circuitry operating in the first mode to the column selection circuitry, first and second column select signals responsive to a second control signal, and wherein:

the first column select signal is to control a read operation and the second column select signal is to control a write operation, and a transition of the second control signal triggers the read operation to complete and simultaneously triggers the write operation to begin.

16. The method of claim 15, further comprising:

providing, from the control circuitry operating in the second mode to the wordline selection circuitry, a second wordline select signal responsive to the first control signal;

providing, from the control circuitry operating in the second mode to the column selection circuitry, third and fourth column select signals responsive to the first control signal, and where the third column select signal is to control a read operation and where the fourth column select signal is to control a write operation.

* * * * *